(12) United States Patent
Rajagopalan et al.

(10) Patent No.: US 8,149,023 B2
(45) Date of Patent: Apr. 3, 2012

(54) RF BUFFER CIRCUIT WITH DYNAMIC BIASING

(75) Inventors: Rangarajan Rajagopalan, San Diego, CA (US); Mishra Chinmaya, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 132 days.

(21) Appl. No.: 12/603,379

(22) Filed: Oct. 21, 2009

(65) Prior Publication Data

US 2011/0089991 A1     Apr. 21, 2011

(51) Int. Cl.
*H03B 1/00*     (2006.01)
(52) U.S. Cl. ........................................ 327/108
(58) Field of Classification Search ........................ None
See application file for complete search history.

(56) References Cited

U.S. PATENT DOCUMENTS

| | | | |
|---|---|---|---|
| 5,493,232 A | 2/1996 | Kube | |
| 5,534,810 A * | 7/1996 | White | 327/308 |
| 5,818,283 A * | 10/1998 | Tonami et al. | 327/436 |
| 7,126,385 B2 * | 10/2006 | Brekelmans et al. | 327/67 |
| 2006/0247880 A1 | 11/2006 | Kapur et al. | |
| 2009/0237125 A1 * | 9/2009 | Zhao et al. | 327/108 |

FOREIGN PATENT DOCUMENTS

CN     101488710 A     7/2009

OTHER PUBLICATIONS

International Search Report and Written Opinion—PCT/US2010/053627—International Search Authority, European Patent Office,Feb. 1, 2011.

* cited by examiner

*Primary Examiner* — Lincoln Donovan
*Assistant Examiner* — Khareem E Almo
(74) *Attorney, Agent, or Firm* — Eric Ho

(57) ABSTRACT

An RF buffer circuit for a voltage controlled oscillator (VCO) includes dynamic biasing circuitry to selectively flip the phase of the output voltage waveform. In a CMOS implementation, a PMOS/NMOS pair is employed in an output path. During a high (voltage) swing mode condition, the phase of the output is flipped such that the output waveform is in phase with the voltages appearing at the gates of the PMOS/NMOS pair. The technique thereby reduces peak gate-to-drain voltages and allows for improved reliability of the MOS devices in a configuration amenable to low phase noise and low power consumption.

28 Claims, 8 Drawing Sheets

High Swing Mode: Vp=GND, Vn=Vdd, SW1=>GND, SW2=>Vdd

Low Swing Mode: $V_P=V_n=Vdd/2$, SW1=>Vdd, SW2=>GND

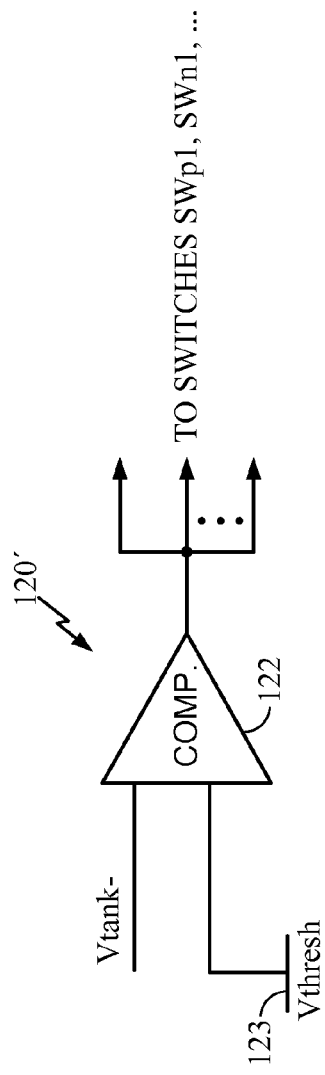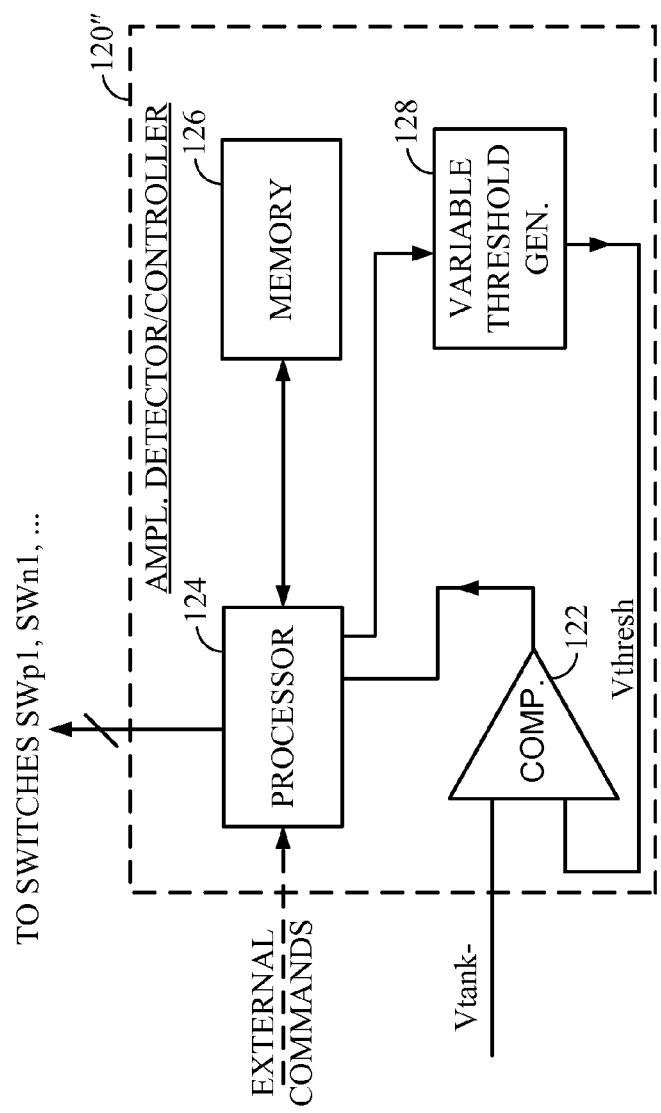
FIG. 7A
FIG. 7B

RF BUFFER CIRCUIT WITH DYNAMIC BIASING

TECHNICAL FIELD

The present disclosure relates generally to RF buffer circuits used in conjunction with RF components such as voltage controlled oscillators (VCOs).

BACKGROUND

Voltage controlled oscillators are well known devices used in a wide variety of RF electronics applications such as frequency synthesizers of RF communications systems. Despite recent advances in their designs, VCOs are still considered one of the most critical design components in RF transceivers. In general, the most important parameters of a VCO are phase noise, power consumption and frequency tuning range. An output buffer circuit is often used to amplify the output of the VCO and to isolate the VCO from load conditions.

In order to meet stringent phase noise specifications of 3G wireless communications standards such those of the CDMA 1X and other protocols, current VCOs produce a differential output voltage with a wide swing, typically up to 3V. This wide voltage swing tends to diminish reliability of CMOS transistors within buffer circuits buffering the VCO output. The wide swing applied to the buffer results in higher than desirable gate-to-drain and gate-to-source voltages $V_{GD}$ and $V_{GS}$ across the buffer circuit transistors, thereby stressing those transistors and creating reliability issues due to both hot carrier injection (HCI) and gate oxide breakdown. Reliable operation is of paramount importance and becomes more challenging as deep submicron processes are used.

Moreover, in portable wireless devices it is beneficial to keep power consumption to a minimum to prolong battery life. Realizing phase noise performance, and in particular, far out phase noise, is important as SAW filters are eliminated from transceiver integrated circuits.

It is desirable to achieve low current consumption and high reliability goals for a VCO and its buffer circuit while maintaining low phase noise operation.

SUMMARY

An RF buffer circuit for a voltage controlled oscillator (VCO) includes dynamic biasing circuitry to selectively flip the phase of the output voltage waveform. In a CMOS implementation, a PMOS/NMOS pair is employed in an output path. During a high (voltage) swing mode condition, the phase of the output is flipped such that the output waveform is in phase with the voltages appearing at the gates of the PMOS/NMOS pair. The technique thereby reduces peak gate-to-drain voltages and allows for improved reliability of the MOS devices in a configuration amenable to low phase noise and low power consumption.

In an exemplary embodiment, a buffer circuit includes first and second transistors and dynamic biasing circuitry, such that a buffered output voltage across the first and second transistors is substantially in-phase with an oscillating voltage at an input terminal of the first or second transistors, or substantially out of phase with the oscillating voltage, on the basis of an input voltage swing condition at one or the other of the first and second transistors. Thereby, peak voltages across transistor terminals may be reduced, allowing for improved reliability of the transistors in a configuration amenable to low phase noise and low power consumption.

The dynamic biasing may include switching circuitry that switches transistor bias conditions such that, during a high input voltage swing mode condition, the buffered output voltage is substantially phase aligned with the oscillating voltage at the input terminals of the first and second transistors. During a low input voltage swing mode condition, the buffered output voltage is substantially out of phase with the oscillating input voltage. An amplitude detector/controller may be included to detect the input voltage swing mode condition and respond to the condition by controlling the biasing voltages of the RF buffer circuit in order to implement the phase alignment.

BRIEF DESCRIPTION OF THE DRAWINGS

FIGS. 7A and 7B show alternate exemplary embodiments for implementing an amplitude detector/controller shown in FIG. 5.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

The present disclosure relates to improved buffer circuits which have particular utility when used in conjunction with a VCO. For convenience, the buffer circuits will be described in connection with VCO core circuits. However, it is understood that the buffer circuits may have other applications, as will be explained further below.

To provide a foundation for the teachings of the present disclosure, reference is first made to a prior art buffer circuit and accompanying VCO core circuit and the time varying voltages expected therein.

Figure 1:
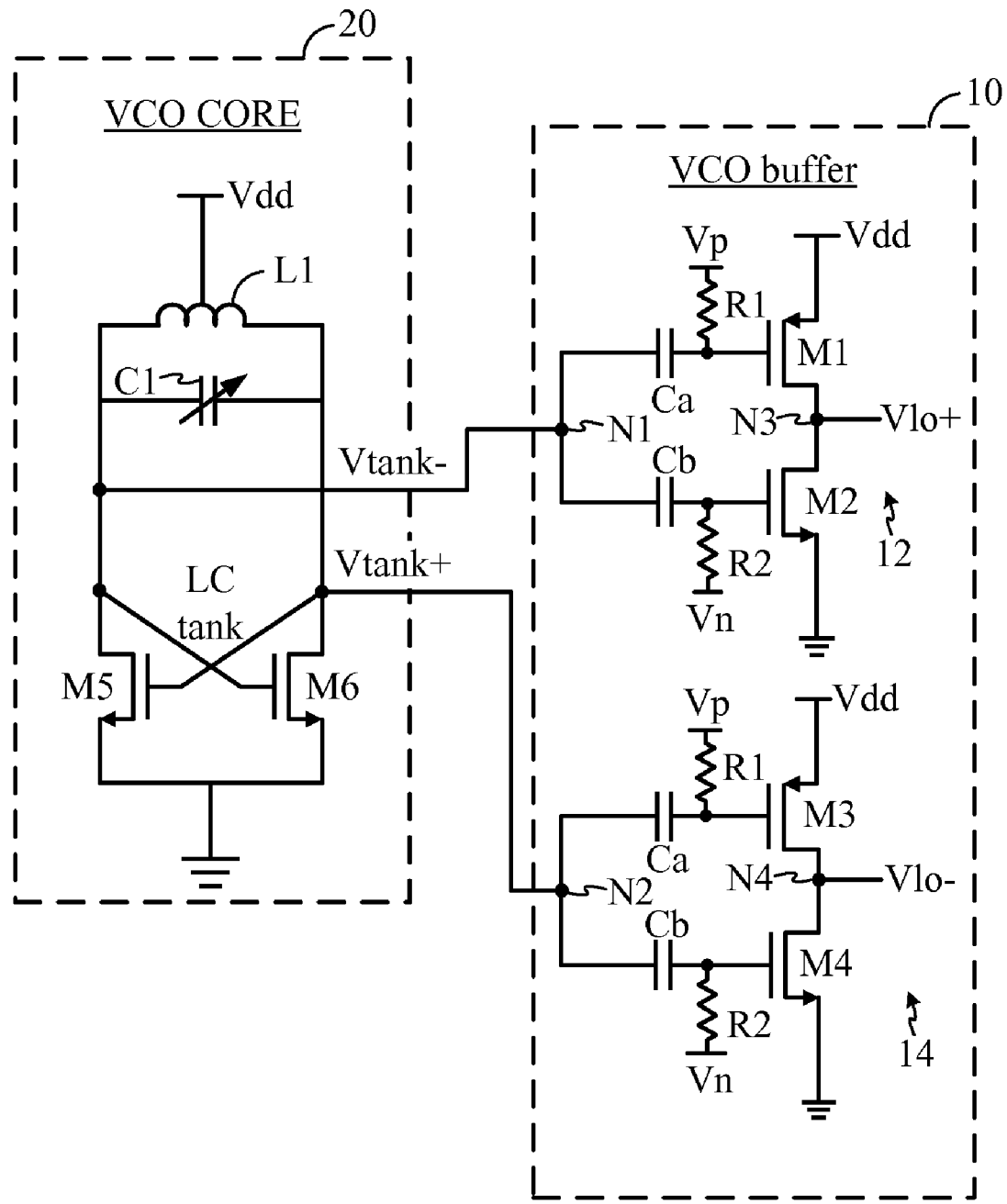
FIG. 1 is a circuit level diagram of a VCO core circuit and a typical RF buffer circuit with separate upper and lower buffer circuit portions.

FIG. 1 is a circuit level diagram of a VCO core circuit 20 and a typical RF buffer circuit 10 with separate upper and lower buffer circuit portions 12, 14.

RF buffer circuit 10 comprises CMOS pairs M1, M2 and M3, M4. Here, RF buffer circuit 10 functions to buffer a differential pair oscillating voltage signal (Vtank− and Vtank+) present at the output of VCO core circuit 20 and received as input voltage signals at differential input pair nodes, N1 and N2, respectively. Upper and lower buffer circuit portions 12 and 14 buffer voltage signal pair Vtank− and Vtank+ to generate a buffered output voltage signal pair, Vlo+ and Vlo−, at buffer circuit output nodes N3 and N6.

Devices M1 and M3 are PMOS transistors. The source terminals of M1 and M3 are biased at Vdd, typically 1.25-1.5V. Devices M2 and M4 are NMOS transistors. The source terminals of M2 and M4 are coupled to ground. The gates of M1-M4 are connected through bias resistors R1-R4 to a voltage source Vp or Vn. Vp and Vn designations are used to match the type of transistor device being biased (i.e., PMOS or NMOS) and typically set at voltage level, Vdd/2.

Two AC coupling capacitor pairs, Ca, Cb are coupled to each end of input pairs node N1, N2 and the other end to a corresponding gate terminal of devices M1-M4. VCO core circuit 20 is a typical VCO architecture and includes an inductor L1 and varactor C1 supplying variable capacitance and connected in parallel to form an LC resonant tank circuit. A pair of cross-coupled transistor devices M5, M6 are connected in parallel with the LC tank circuit to implement the gain function of the VCO core circuit. A bias voltage Vdd is applied at a mid-point of inductor L1.

VCO core circuit 20 is suitable for use in mobile communication devices such as cell phones. Cell phones at times are required to draw more power than at other times. It is known to intentionally switch to high power mode from low power mode to increase, for example, phone sensitivity. For instance, one known technique involves switching the cell phone into high power mode when the phone receive signal to noise ratio (SNR) has degraded below a threshold.

In high power mode, bias voltage Vdd at the VCO core circuit 20 is supplied at a higher level than in the low power mode. The result is that the output differential voltage swing at each of voltage signals, Vtank− and Vtank+, is higher in high power mode, and can be as high as 3V differential peak in order to meet stringent phase noise specification requirements when operating for example in the PCS (1900 Mhz) wireless communications band of a CDMA ix network. A typical low power mode, differential output swing is about 1.5V When switching between high power and low power modes, RF buffer circuit 10 inevitably experiences high and low voltage swings paralleling the voltage levels at the output of VCO core circuit 20. These high and low voltage swings define high swing and low swing modes, respectively. In the high swing mode, the voltage level swings at the gates of devices M1 and M3 can be as high as 1.5Vdd, while the voltage level at the respective drain terminals can be as low as 0V.

Such high voltage level swings result in a $V_{GS}$ and $V_{GD}$ of about 1.5 Vdd. With conventional MOSFET type CMOS devices typically used in portable communications devices, such swings can cause reliability issues due to both hot carrier injection (HCI) and gate oxide breakdown. The same is also true for NMOS devices M2 and M4.

Figure 2:
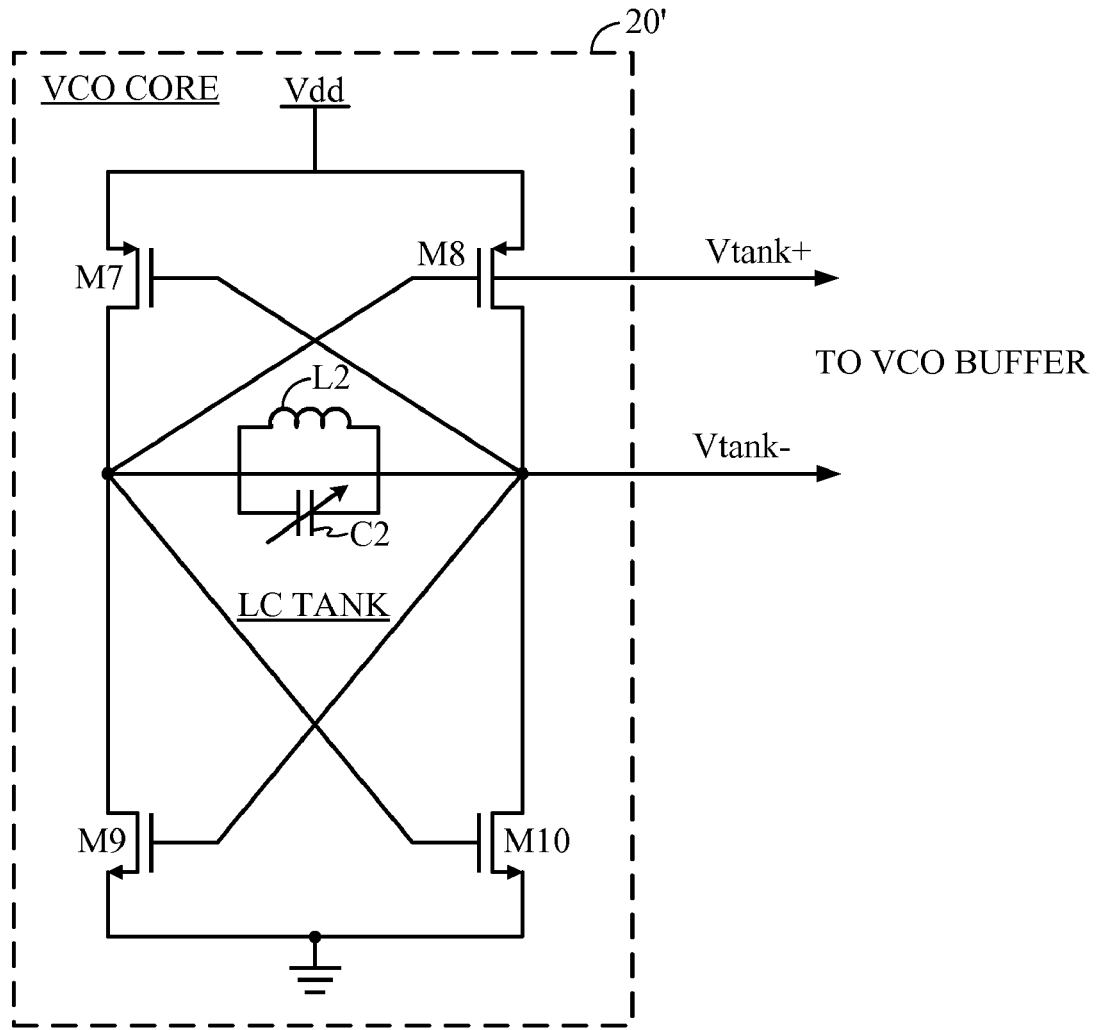
FIG. 2 is a circuit level diagram of an alternate configuration of a VCO core circuit.

FIG. 2 is a circuit level diagram of an alternate configuration of a VCO core circuit 20'. VCO core circuit 20' can be used, e.g., within a mobile device transceiver as an alternative to VCO core circuit 20, to generate differential output voltage signals, Vtank+ and Vtank−. VCO core circuit 20' employs two pairs of cross-coupled FETs, M7, M8 and M9, M10. An LC tank consisting of inductor L2 and varactor C2 are connected in parallel. The bias voltage Vdd is brought to the sources of FETs M7 and M8. The sources of FETs M9 and M10 are tied to ground. This arrangement allows VCO core circuit 20', as with VCO core circuit 20, to avoid the use of a constant current source to minimize power consumption. Here, also however, differential output voltage signals, Vtank+ and Vtank−, have substantially the same variation in voltage level swing as described for that of VCO core circuit 20 in FIG. 1.

One approach to alleviate the high swing mode problem is to connect a capacitor across the plus and minus gates of CMOS pair M1, M2 (and also across M3, M4). However, this approach may negatively impact tuning range due to higher capacitance in the high swing mode. In addition, Q degradation occurs in the high swing mode. Further, the value of the coupling capacitor required would be on the order of Ca or Cb, requiring more area on the integrated circuit.

Another possible solution is to use thick oxide devices for MOS devices M1-M4. While this strategy may enhance device reliability, it tends to adversely impact tuning range. Furthermore, a higher current may be experienced because of higher self capacitance of the RF buffer circuit.

Figure 3:
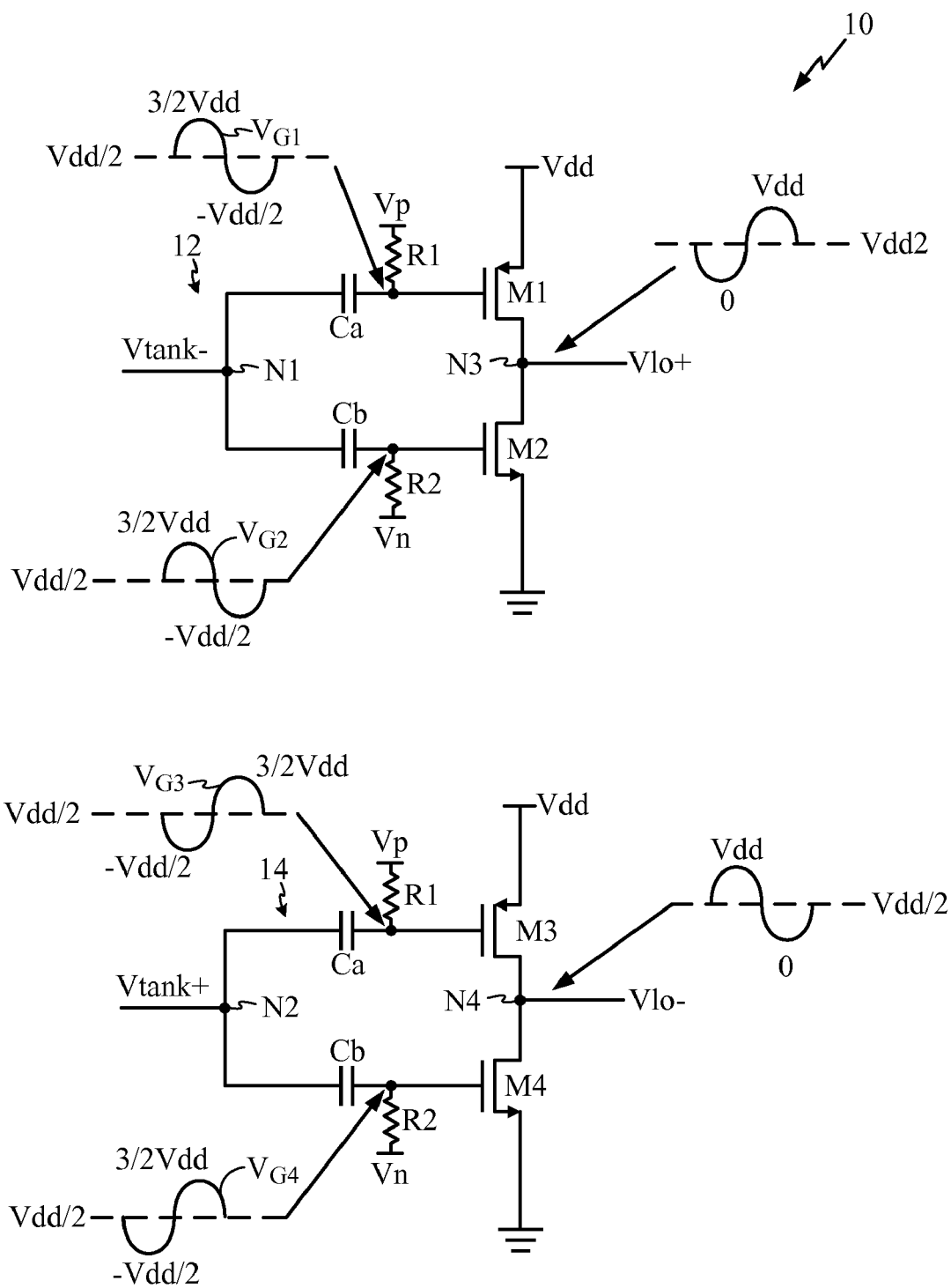
FIG. 3 shows voltage characteristics at various nodes of the upper and lower buffer circuit portions shown in FIG. 1.

FIG. 3 shows voltage characteristics at various nodes of the upper and lower buffer circuit portions shown in FIG. 1.

The waveforms illustrate the cause and effect relationship of high $V_{GD}$ and $V_{GS}$ voltage levels at the terminals of MOS devices M1-M4. In essence, the voltage waveforms $V_{G1}$, $V_{G2}$ at the gate terminals of devices M1 and M2 (at respective nodes N5 and N6) are in phase with one another, but 180° out of phase with the output voltage waveform Vlo+ at node N3 (i.e., the drain voltage waveform). (Nomenclature "lo" is used for "local oscillator".) Likewise, the voltage waveforms $V_{G3}$ and $V_{G4}$ are in phase, but out of phase with Vlo−. Thus, when $V_{G1}$ and $V_{G2}$ hit their peaks at 3/2 Vdd, Vlo+ is at a trough at 0V, and the peak swing is 3/2 Vdd (=1.95V for Vdd=1.3V). As illustrated, the peak swings occur twice per wavelength cycle for each MOS device.

In accordance with exemplary embodiments, the high voltage swing occurring across the gate-to-drain and gate-to-source electrodes of devices M1-M4 are reduced by means of a dynamic biasing technique. The technique causes the buffered output voltages at the drains to flip in phase by 180°, so as to be in phase with the gate voltage waveforms. That is, as a function of time, the peaks of the gate voltages will coincide with the peaks of the drain voltages, rather than the troughs. Thereby, the swings across the various transistor nodes can be brought to within reliable limits.

Figure 4:
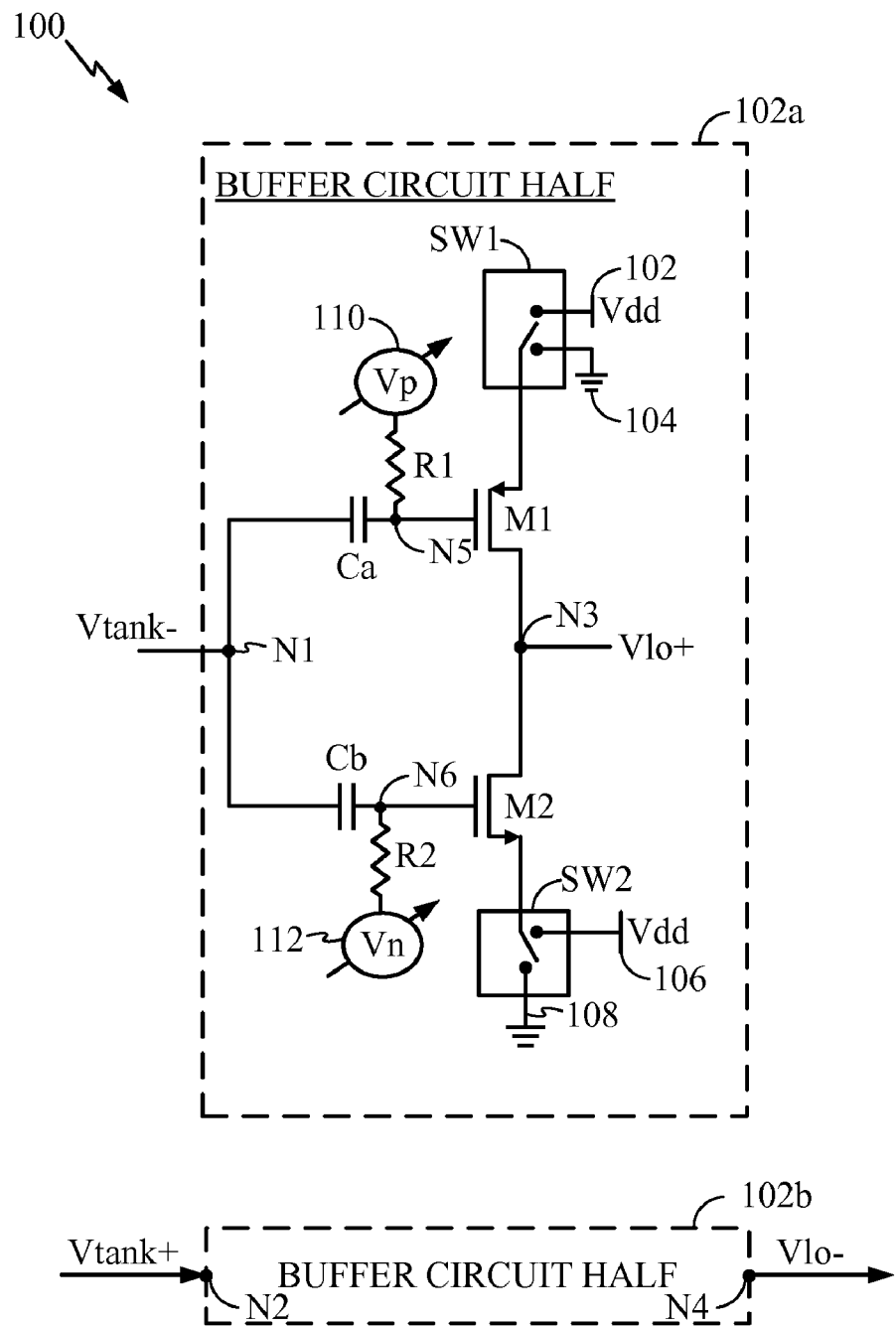
FIG. 4 is a schematic diagram of an RF buffer circuit in accordance with an exemplary embodiment, with the lower buffer circuit portion shown in block view while the upper circuit portion is shown in greater circuit detail.

FIG. 4 is a schematic diagram of an RF buffer circuit 100 in accordance with an exemplary embodiment, with the lower buffer circuit portion 102b shown in block view while the upper circuit portion 102a is shown in greater circuit detail.

Upper buffer circuit portion 102a buffers input voltage signal Vtank− while lower buffer circuit portion 102b buffers input voltage signal Vtank+ to produce buffered outputs Vlo+ and Vlo−, respectively, at output nodes N3 and N4. Again, only the details of upper buffer circuit portion 102a are shown for clarity of illustration. It should be understood that the description of upper buffer circuit portion 102a is equally applicable and descriptive of the operation of lower buffer circuit portion 102b.

RF buffer circuit 100 has a circuit topology similar to buffer circuit 10 described above, but modified with means to implement dynamic biasing of CMOS transistor pair M1, M2. The dynamic biasing may result in improved reliability, phase noise, and/or current consumption as compared to prior art circuits. Switches SW1 and SW2 as well as variable biasing sources 110 (supplying voltage Vp) and 112 (supplying voltage Vn) are employed to effectuate the dynamic biasing.

RF buffer circuit 100, as well as the other buffer circuits and VCOs described herein, are preferably implemented within a larger integrated circuit. The integrated circuit can be part of a mobile communication device such as a cellular phone, a laptop, a personal digital assistant (PDA), a netbook, and so on. The mobile device may be configured to operate in wireless technologies such as CDMA, WCDMA, GSM, LTE, Bluetooth, and so on. It is understood that these are just presented as examples and that the invention is by no means limited to use with these technologies.

During a high swing mode condition, switch SW1, which supplies the bias to the source terminal of transistor device M1, is switched to a point of ground potential 104. Switch SW2, which supplies bias to the source of transistor M2, is switched to a source of potential 106 supplying voltage Vdd. Source of bias potential 112 supplies voltage Vn equal to Vdd. Source of bias potential 110 supplies voltage Vp at ground potential.

During a low swing mode condition, switch SW1 is switched to source of potential 102 supplying Vdd. Switch Sw2 is switched to point of ground potential 108. Both Vp and Vn are supplied at a level of Vdd/2.

Thus, during the high swing mode condition, by coupling the source terminal of M1 to ground, the source terminal of M2 to Vdd, setting Vp at ground potential and Vn to Vdd, the current flow along the output path is reversed as compared to the conventional biasing schemes described above. Thereby, the phase of the output voltage waveform is flipped by 180°. As a consequence, Vlo+ is in phase with $V_{G1}$ and $V_{G2}$.

This reduces the peak voltage swings of $V_{GD}$ and $V_{GS}$ for the interconnected MOS devices which leads to higher reliability of the devices. The same biasing is used in the lower buffer circuit part 102b of RF buffer circuit 100 to buffer differential input Vtank+ and produce buffered output Vlo− in phase with the voltage waveforms at the gate terminals of MOS devices in the lower buffer circuit portion 102b.

During the low swing mode condition, the biasing is substantially the same as that used in buffer circuit 10 of FIG. 1 (i.e., M1 source is tied to Vdd, M2 source is tied to ground, Vp=Vn=Vdd/2). Thus, the same or substantially the same performance as that of buffer circuit 10 of FIG. 1 in terms of phase noise, current consumption, tuning range, etc. is realized.

Figure 5:
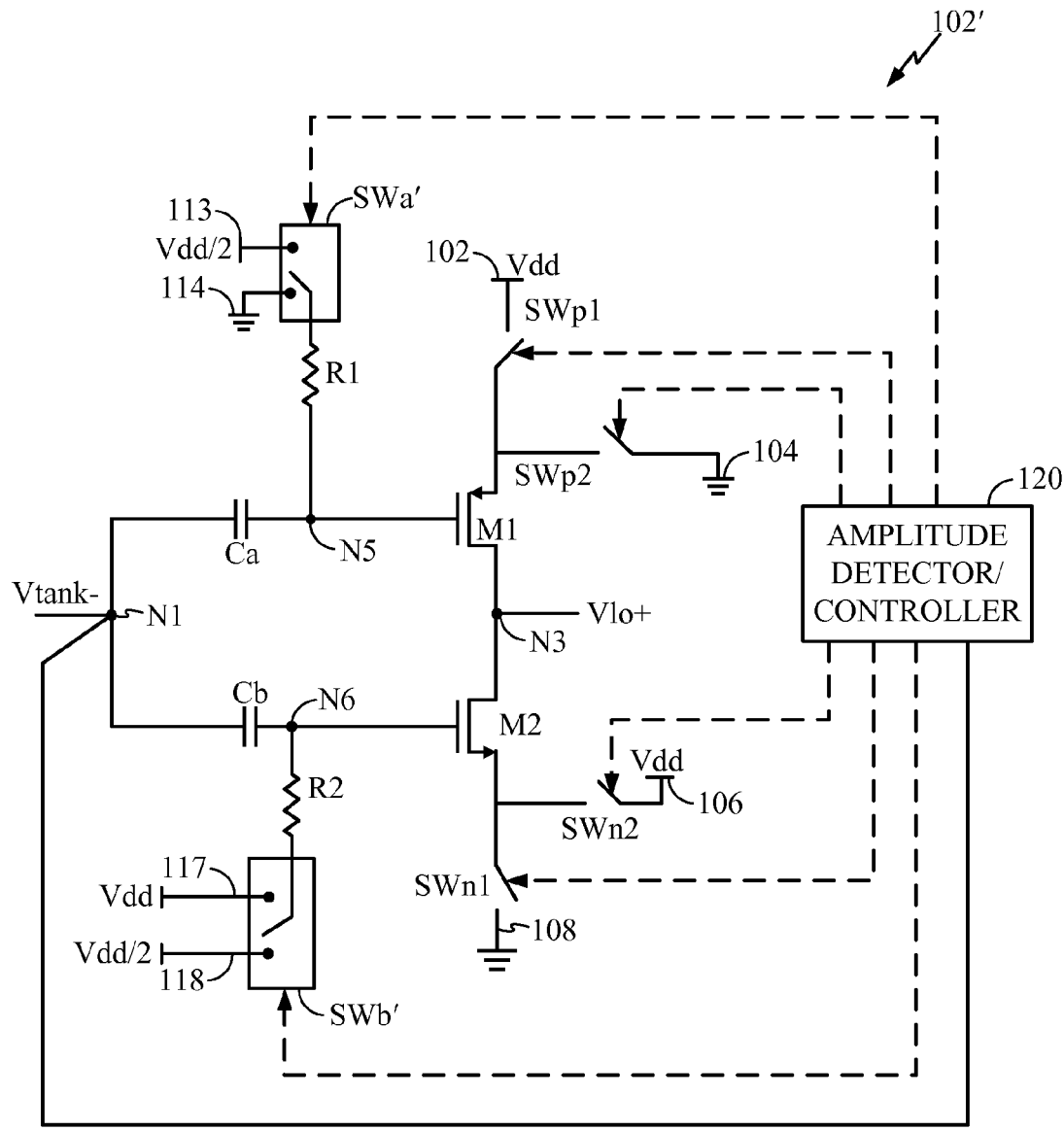
FIG. 5 is a schematic diagram of an RF buffer circuit in accordance with another exemplary embodiment, with the upper and lower buffer circuit portions shown in block view, and the upper buffer circuit portion also shown in greater circuit detail.
Figure 5:
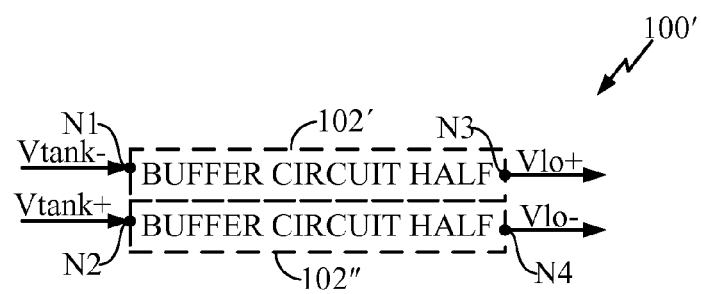

FIG. 5 is a schematic diagram of an RF buffer circuit 100' in accordance with another exemplary embodiment, with the upper and lower buffer circuit portions 102' and 102" shown in block view, and the upper buffer circuit portion 102' also shown in greater circuit detail.

Differential voltages Vtank− and Vtank+ from a VCO core circuit or the like are applied to respective buffer circuit portions 102' and 102", to provide buffered outputs Vlo+ and Vlo−.

Comparing RF buffer circuit 100' with RF buffer circuit 100 of FIG. 4, switch SW1 is replaced by a pair of switches SWp1 and SWp2; and switch SW2 is replaced by a pair of switches SWn1 and SWn2. Switch SWp1 is coupled between the source of PMOS device M1 and voltage source Vdd. Switch SWp2 is coupled between the source terminal of M1 and a point of ground potential 104. Switches SWn2 and SWn1 are likewise coupled to Vdd and ground, respectively, and to the source terminal of M2. Variable voltage sources 110 and 112 of RF buffer circuit 100 are each embodied as two position flip type switches SWa' and SWb', respectively. Switch SWa' switches between voltage source 113 supplying Vdd/2 and ground point 114. Switch SWb' switches between voltage sources 117 and 118 supplying Vdd and Vdd/2, respectively.

RF buffer circuit 100' is provisioned with an amplitude detector/controller 120 which detects an average amplitude level of Vtank− at input node N1, and controls the switch positions of switches SWp1, SWp2, SWn1, SWn2, SWa' and SWb' in accordance with the detected amplitude.

When amplitude detector/controller 120 detects that the average amplitude of Vtank− exceeds a predetermined threshold, this signifies that a high swing mode condition is in effect. Amplitude detector/controller 120 then commands switches SWp2 and SWn2 closed, switches SWp1 and SWn1 open, SWa' to switch to ground and SWb' to switch to Vdd. When the average amplitude of Vtank− is below the threshold, RF buffer circuit 100' is in a low swing mode condition and amplitude 120 commands the switches to their opposite positions. Since Vtank− and Vtank+ are a differential voltage pair, they have the same average amplitude on an absolute voltage basis. Therefore, either the same unit 120, or separate units, can be used to detect the Vtank+ amplitude in the lower buffer circuit part 102" and command the switches therein accordingly.

Figure 6A:
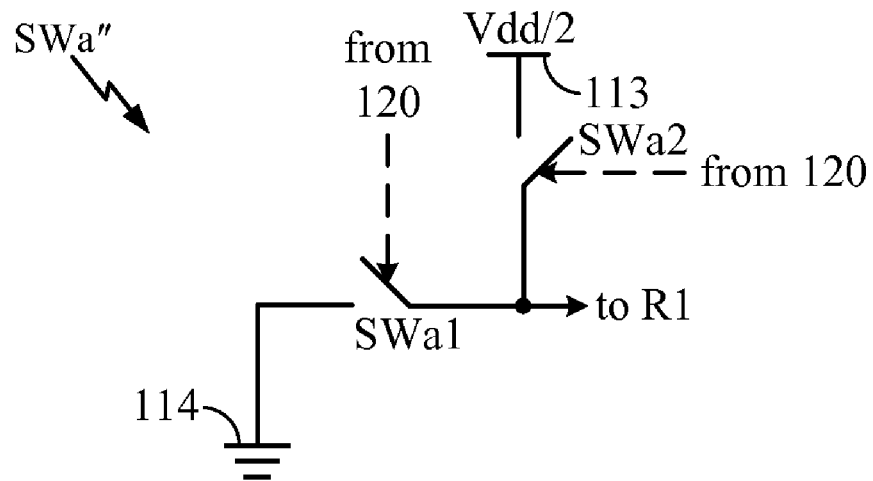
FIGS. 6A and 6B show schematic diagrams for implementing the two switch blocks, respectively, shown in the upper buffer circuit portion of FIG. 5.
Figure 6B:
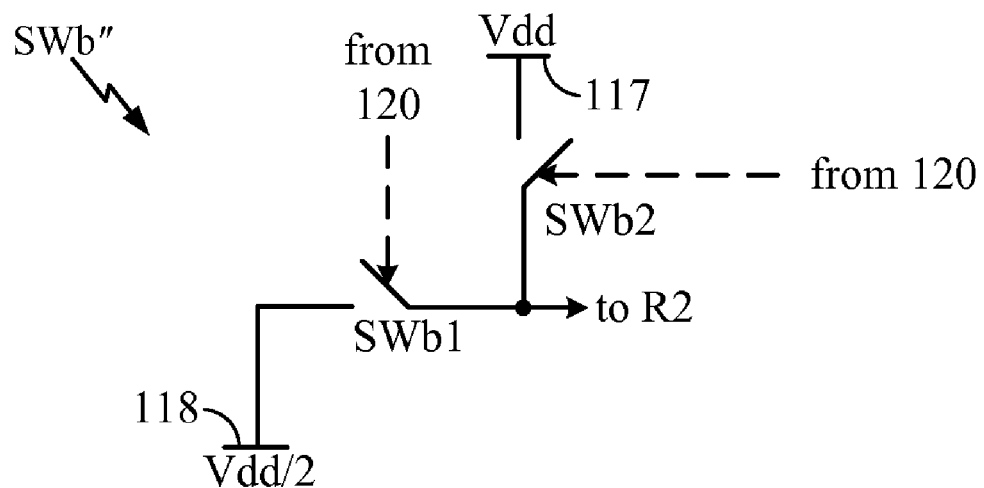

FIGS. 6A and 6B show schematic diagrams for implementing the two switch blocks, SWa" and SWb", respectively, shown in the upper buffer circuit portion 102' of FIG. 5.

Switch block SWa" is comprised of switches SWa1 and SWa2, which together selectively switch resistor R1 to ground or Vdd/2 under the control of amplitude detector/controller 120. Likewise, switch block SWb" comprises switches SWb1 and SWb2 to switch resistor R2 between Vdd and Vdd/2. It is noted here that all of the switches such as those of FIGS. 6A and 6B as well as switches SWp1, SWp2, etc. of FIG. 5 are preferably added in nodes where capacitance is not important and where they will not impact the Q of the circuit. The switch sizes may be determined by the ON resistance and available area.

The integrated circuit area upon which buffer circuit 100 is located is usually dominated by the AC coupling capacitors Ca, Cb and not by the active devices. Therefore, the "area hit" (i.e., the loss of otherwise usable area or the extra area required due to the additional switches such as SWp1, SWa1, etc.) is small.

FIGS. 7A and 7B show alternate exemplary embodiments for implementing the amplitude detector/controller 120', 120", shown in FIG. 5.

Amplitude detector/controller 120' is comprised of a comparator 122 which provides a logic level output as a function of the difference in voltage applied to its two input ports. Differential voltage Vtank− is applied to a first input port. A second input port is tied to a source of potential 123 supplying a predetermined threshold Vthresh. When the average level of Vtank− exceeds Vthresh, this is indicative of a high swing mode condition, and a logic high (or low) is output and applied to each of switches SWp1, SWn1, etc., to control them according to their correct positions in the high swing mode condition. When Vthresh exceeds Vtank−, the opposite logic level is provided to the switches to implement the designated switch positions in the low swing mode condition.

An alternate exemplary embodiment of an amplitude detector/controller 120" of FIG. 7B likewise includes a comparator 122 which compares the average level of input voltage Vtank− (or Vtank+) to a threshold Vthresh, and supplies a logic level output accordingly. However, this logic output is applied to a processor 124 which in turn outputs commands to the various circuit switches to carry out the necessary switch control in the high swing and low swing mode conditions. In addition, the threshold voltage Vthresh is supplied from a variable threshold generator 128 which is controlled by processor 124. For example, external commands can be applied to processor 124 to set a selected level for Vthresh. The selected level may, for instance, be established to optimize or trade off performance parameters such as phase noise, power consumption and tuning range under certain conditions. A memory 126 is also employed to store instructions that processor 126 executes to carry out its functions.

Figure 8A:
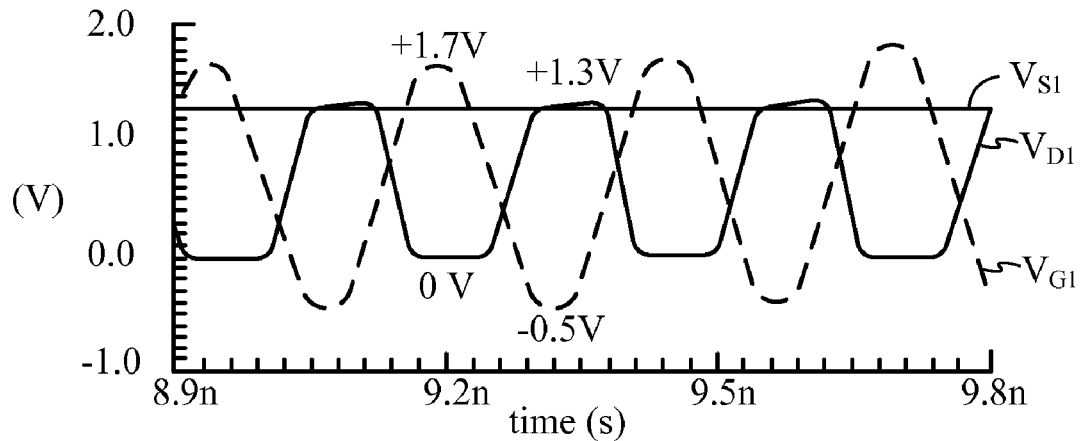
FIGS. 8A and 8B are graphs depicting exemplary voltage waveforms at various corresponding transistor terminals of the RF buffer circuits shown in FIGS. 1 and 4 (and 5), respectively.
Figure 8B:
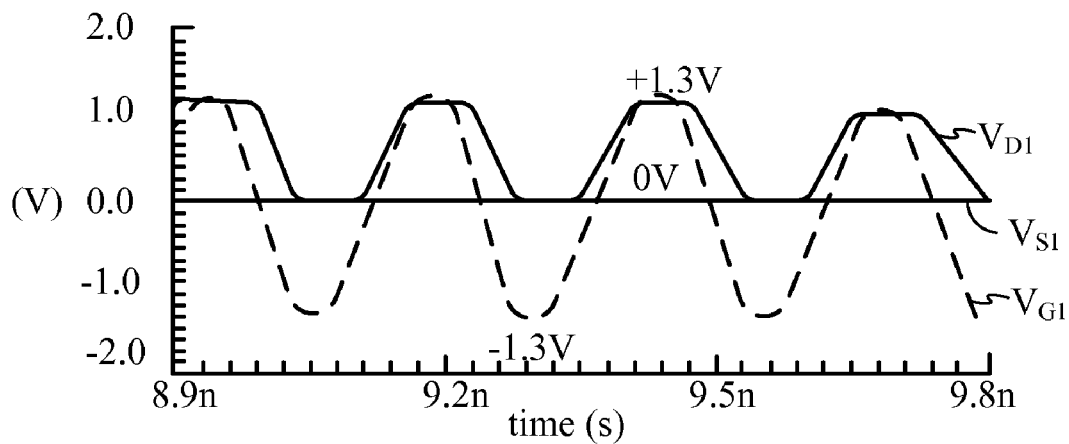

FIGS. 8A and 8B are graphs depicting exemplary voltage waveforms at various corresponding transistor terminals of the RF buffer circuits shown in FIGS. 1 and 4 (and 5), respectively.

Here, measured voltage waveforms occurring at various nodes in example RF buffer circuits are shown to illustrate potential advantages of the exemplary embodiments. Voltages $V_{S1}$, $V_{D1}$ and $V_{G1}$ represent measured voltages at the source, drain and gate terminals, respectively, of transistor device M1 in the various buffer circuits in a high swing mode condition of operation. FIG. 8A shows results for RF buffer circuit 10 of FIG. 1; and FIG. 8B shows results for both RF buffer circuits 100 and 100' of FIGS. 4 and 5. While only results for PMOS device M1 are shown, the peak voltage swings across important nodes in these figures should also be expected for NMOS device M2, as well as for the MOS devices in any lower buffer circuit portions (e.g., buffer circuit portions 14 and 102"). Biasing voltage Vdd of 1.3V was used in the examples.

As mentioned above, the reliability of MOSFETS can be compromised if the maximum voltage swings from gate-to-drain, gate-to-source and drain-to-source terminals exceed reliable limits. Thus, exemplary embodiments disclosed herein are designed to reduce these swings and thereby enhance reliability. As seen in FIG. 8A, in conventional RF buffer circuit 10, when $V_{G1}$ swings to its maximum at about 1.7V, $V_{D1}$ is at an opposite phase level of 0V. When $V_{G1}$ troughs at −0.5V, $V_{D1}$ and $V_{S1}$ are both at +1.3V. Thus the maximum gate-to-drain voltage swing, $V_{GD,MAX}$ is from 1.3V to −0.5V, equaling 1.8V. The maximum gate-to-source swing, $V_{GS,MAX}$, is also 1.8V. $V_{DS,MAX}$ is 1.3V.

With example RF buffer circuits 100 and 100' as shown in FIG. 8B, as $V_{G1}$ peaks at 1.3V, so does $V_{D1}$ at the same level. As $V_{G1}$ troughs at −1.3V, both $V_{D1}$ and $V_{S1}$ are 0V. Thus, $V_{GD,MAX}$, $V_{GS,MAX}$ as well as $V_{DS,MAX}$ all measure 1.3V in this example, a marked improvement over that of circuit 10. An improvement in phase noise performance is also expected with circuits 100, 100'.

The above exemplary embodiments of an RF buffer circuit have been described in the context of a VCO application. However, RF buffer circuits in accordance with the invention may have other applications. It should be appreciated for example that buffer circuits 100 or 100' may be used as part of a variable gain section in a TX chain of a transceiver, in either a pre-DA (driver amplifier) portion or as an LO buffer to the up-converter (i.e., reduce power as Pout changes).

Buffer circuits 100, 100' may also be used as part of a gain state switching scheme in a RX chain, i.e., within a low noise amplifier (LNA).

In another application, buffer circuits as 100, 100' may be used as an XO buffer, for changing from high power to low power, or when connected to multiple inputs of different voltage swings.

In still another application, buffer circuits as 100, 100' may be used to drive variable loads, such as in an inter-chip clock distribution application (e.g., ADC clock-gen in laptops).

Although the exemplary embodiments described above and corresponding figures have described the use of CMOS transistor circuits, one skilled in the art would clearly understand the principles explained herein could also be applied to BJT transistor circuits to provide the same or similar benefits discussed herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another.

A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An RF buffer circuit comprising:
   first and second transistors; and
   dynamic biasing circuitry such that a buffered output voltage across the first and second transistors is substantially in-phase with an oscillating voltage at an input terminal of the first or second transistors, or substantially out of phase with said oscillating voltage, on the basis of an input voltage swing condition, set by an amplitude detector/controller having a comparator, at one or the other of the first and second transistors.

2. An RF buffer circuit for coupling to an output of a VCO core circuit, the RF buffer circuit including two buffer circuit portions, each buffer circuit portion comprising:
   means for detecting a high swing mode condition and a low swing mode condition at plural input terminals thereof; and
   an amplitude detector/controller, including a comparator responsive to the detected swing mode condition, to set the biasing voltage of the RF buffer circuit so as to phase align a voltage at an output terminal to a voltage at a biasing input terminal.

3. The buffer circuit of claim 2, wherein the amplitude detector/controller includes a first switching circuit and a second switching circuit connected to a first transistor and to a second transistor, respectively.

4. The RF buffer circuit of claim 3, wherein the first switching circuit is connected to the source of the first transistor and the second switching circuit is connected to the source of the second transistor.

5. The RF buffer circuit of claim 4, wherein the first switching circuit is switched to a point of ground potential during a high swing mode condition and is switched to a first source of biasing potential during a low swing mode condition.

6. The RF buffer circuit of claim 4, wherein the second switching circuit is switched to a second source of biasing potential during a high swing mode condition and is switched to ground during a low swing mode condition.

7. The RF buffer circuit of claim 3, wherein the amplitude detector/controller further includes means for varying the biasing potential applied at the gates of the first and second transistors, respectively.

8. The RF buffer circuit of claim 7, wherein the means for varying comprise a first variable biasing source and a second variable biasing source connected at the gates of corresponding first and second transistors via a first resistor and a second resistor, respectively.

9. The RF buffer circuit of claim 7, wherein the means for varying comprise a first switch block and a second switch block.

10. The RF buffer circuit of claim 9, wherein the first switch block is switched to ground during a high swing mode condition and is switched to half the voltage of the first source of bias potential during a low swing mode condition.

11. The RF buffer circuit of claim 9, wherein the second switch block is switched to the voltage of the first source of bias potential during a high swing mode condition and is switched to half the voltage of the first source of bias potential during a low swing mode condition.

12. The RF buffer circuit of claim 1, wherein the inputs to the RF buffer circuit are a pair of differential oscillating voltage signals.

13. The RF buffer circuit of claim 2, wherein the amplitude detector/controller further comprises a processor, a memory and a variable threshold generator coupled to the comparator.

14. An RF buffer circuit comprising:
   first and second circuit portions having respective input terminals at which first and second oscillating voltages are applied, respectively;
   each circuit portion comprising:
   first and second transistors coupled in series, wherein a first output terminal of the first transistor is coupled to a first output terminal of the second transistor at a first output terminal of the buffer circuit providing a buffered oscillating output voltage;
   first and second capacitors coupled between the input terminal and respective gate terminals of the first and second transistors; and
   dynamic biasing circuitry to dynamically bias a second output terminal of the first transistor and a second output terminal of the second transistor, using an amplitude detector/controller having a comparator, to phase align the buffered oscillating output voltage with oscillating voltages at the gate terminals of the first and second transistors.

15. The RF buffer circuit of claim 14, wherein the dynamic biasing circuitry comprises:
   a first switch for switching the second output terminal of the first transistor between a first source of bias potential and a point of ground potential;

a second switch for switching the second output terminal of the second transistor between a second source of bias potential and a point of ground potential;

wherein, during a high swing mode condition, the first switch is switched to the point of ground potential and the second switch is switched to the second source of bias potential, and during a low swing mode condition, the first switch is switched to the first source of bias potential and the second switch is switched to the point of ground potential.

16. The RF buffer circuit of claim 14, wherein the first and second oscillating voltages at the input terminals are a pair of differential voltages.

17. An RF buffer circuit comprising:
first and second circuit portions having respective input terminals at which first and second oscillating voltages are applied, respectively;
each circuit part comprising:
first and second MOS devices coupled in series, wherein a first output terminal of the first MOS device is coupled to a first output terminal of the second MOS device at a first output terminal of the RF buffer circuit providing a buffered oscillating output voltage;
first and second capacitors coupled between the input terminal and respective gate terminals of the first and second MOS devices; and
dynamic biasing circuitry including an amplitude detector/controller having a comparator coupled to the second terminals of the first and second MOS devices, wherein (i) during a high swing mode condition as detected by the comparator, the second output terminal of the first MOS device is biased at a first level of low potential and the second output terminal of the second MOS device is biased at a first level of high potential, and (ii) during a low swing mode condition as detected by the comparator, the second output terminal of the first MOS device is biased at a second level of high potential and the second output of the first MOS device is biased at a second level of low potential.

18. The RF buffer circuit of claim 17, wherein:
during the high swing mode condition, the gate of the first MOS device is tied, through a first biasing path, to a third level of low potential and the gate of the second MOS device is tied, through a second biasing path, to a third source of bias potential; and
during the low swing mode condition, the gate of the first MOS device is tied, through the first biasing path, to a fourth level of high potential and the gate of the second MOS device is tied, through the second biasing path, to the fourth level of high potential.

19. The RF buffer circuit of claim 18, wherein the first and second biasing paths each contain resistive elements.

20. The RF buffer circuit of claim 18, wherein:
the first, second and third levels of low potential are each ground potential; and
the first, second and third levels of high potential are levels of equal potential $V_{DD}$, and the fourth level of high potential is substantially $V_{DD}/2$.

21. The RF buffer circuit of claim 17, wherein the amplitude detector/controller further comprises a processor, a memory and a variable threshold generator coupled to the comparator in which to detect the high and low swing mode conditions and to control the dynamic biasing of the first and second MOS devices.

22. The RF buffer circuit of claim 17, wherein the first MOS device is a PMOS device and the second MOS device is an NMOS device.

23. The RF buffer circuit of claim 17, wherein the first and second oscillating voltages at the input terminals are a pair of differential voltages.

24. The RF buffer circuit of claim 17, wherein the first and second sources of bias potential are a common source of bias potential.

25. The RF buffer circuit of claim 17, further comprising in combination therewith, a VCO core circuit for providing the first and second differential voltages.

26. The RF buffer circuit of claim 17, wherein the RF buffer circuit is formed on a single CMOS integrated circuit.

27. The RF buffer circuit of claim 17, wherein the RF buffer circuit is part of a wireless communications device.

28. The RF buffer circuit of claim 14, wherein the amplitude detector/controller further comprises a processor, a memory and a variable threshold generator coupled to the comparator.

* * * * *